(12) United States Patent
Feng (10) Patent No.: US 7,900,128 B1
(45) Date of Patent: Mar. 1, 2011

(54) DATA DEPENDENT SCRAMBLER WITH IMPROVED GLOBAL CONSTRAINT

(75) Inventor: Weishi Feng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/150,636

(22) Filed: Apr. 30, 2008

Related U.S. Application Data (62) Division of application No. 10/714,804, filed on Nov. 17, 2003, now Pat. No. 7,475,331.

(60) Provisional application No. 60/509,356, filed on Oct. 7, 2003.

(51) Int. Cl.
*G06F 11/00* (2006.01)

(52) U.S. Cl. ......... 714/809; 714/701; 714/755; 714/810; 714/798

(58) Field of Classification Search .................. None
See application file for complete search history.

(56) References Cited

U.S. PATENT DOCUMENTS

| | | | |
|---|---|---|---|
| 4,724,541 A | 2/1988 | Mallick | |
| 5,757,294 A * | 5/1998 | Fisher et al. | 341/59 |
| 5,898,394 A | 4/1999 | Kobayashi et al. | |
| 6,075,859 A | 6/2000 | Rose | |
| 6,079,041 A | 6/2000 | Kunisa et al. | |
| 6,177,890 B1 * | 1/2001 | Keirn et al. | 341/59 |
| 6,204,781 B1 * | 3/2001 | Aziz et al. | 341/59 |
| 6,241,778 B1 | 6/2001 | de Lind van Wijngaarden et al. | |
| 6,243,496 B1 | 6/2001 | Wilkinson | |
| 6,269,163 B1 | 7/2001 | Rivest et al. | |
| 6,278,386 B1 | 8/2001 | Hogan | |
| 6,377,532 B1 | 4/2002 | Jung et al. | |
| 6,476,737 B1 * | 11/2002 | Caroselli et al. | 341/59 |
| 6,531,968 B2 | 3/2003 | Ahn et al. | |
| 6,603,412 B2 * | 8/2003 | Gatherer et al. | 341/61 |
| 6,631,490 B2 | 10/2003 | Shimoda | |
| 6,718,501 B1 | 4/2004 | Brody et al. | |
| 6,737,996 B2 | 5/2004 | Kurokawa et al. | |
| 6,778,104 B2 | 8/2004 | Chen et al. | |
| 6,897,792 B1 * | 5/2005 | Feng | 341/59 |
| 7,006,019 B2 * | 2/2006 | Lee et al. | 341/59 |
| 7,020,833 B2 | 3/2006 | Watanabe et al. | |
| 7,158,058 B1 | 1/2007 | Yu | |
| 7,218,255 B1 | 5/2007 | Feng et al. | |
| 7,234,097 B1 * | 6/2007 | Feng et al. | 714/758 |
| 7,269,778 B1 | 9/2007 | Feng et al. | |
| 7,318,185 B2 | 1/2008 | Khandani et al. | |
| 7,392,464 B1 * | 6/2008 | Feng et al. | 714/809 |
| 7,436,332 B2 * | 10/2008 | Lakus-Becker | 341/59 |
| 7,486,208 B2 * | 2/2009 | Cideciyan et al. | 341/58 |
| 2003/0099359 A1 | 5/2003 | Hui | |
| 2006/0220928 A1 * | 10/2006 | Ito et al. | 341/50 |

\* cited by examiner

*Primary Examiner* — Syed A. Zia (57) ABSTRACT

A data dependent descrambler for a communications channel that receives a scrambling seed and a scrambled user data sequence with N symbols each with M bits comprises a first decoder that analyzes adjacent symbols of the scrambled user data sequence, that performs G-constraint decoding on the adjacent symbols when a first of the adjacent symbols is an all-one symbol and that does not perform G-constraint encoding when the first of the adjacent symbols is not an all-one symbol. A first descrambler communicates with the first decoder and generates a user data sequence based on the scrambled user data sequence and the scrambling seed.

26 Claims, 8 Drawing Sheets

DATA DEPENDENT SCRAMBLER WITH IMPROVED GLOBAL CONSTRAINT

CROSS-REFERENCE TO RELATED APPLICATIONS

This application is a divisional of U.S. patent application Ser. No. 10/714,804, filed Nov. 17, 2003, which claims the benefit of U.S. Provisional Application No. 60/509,356, filed on Oct. 7, 2003. The disclosures of the above applications are incorporated herein by reference in their entirety.

FIELD OF THE INVENTION

The present invention relates to data coding in a communications channel, and more particularly to data coding that reduces the number of consecutive zeros in a communications channel.

BACKGROUND OF THE INVENTION

Magnetic storage systems such as disk drives include a magnetic medium or platter with a magnetic coating that is divided into data tracks. The data tracks are divided into data sectors that store fixed-sized data blocks. A read/write head typically includes a write circuit and write element such as an inductor that selectively generates positive and negative magnetic fields that are stored by the magnetic medium. The stored positive and negative fields represent binary ones and zeros. The read/write head includes an element such as a magneto-resistive element that senses the stored magnetic field to read data from the magnetic medium. A spindle motor rotates the platter and an actuator arm positions the read/write head relative to the magnetic medium.

Magnetic storage systems typically code the user data sequence or user data using Run Length Limited (RLL) code. RLL coding reduces sequences in the user data that may cause problems with timing circuits of the magnetic storage system. For example, a RLL code enforces constraints on the number of consecutive ones and/or zeros that are allowed to occur in the data. The efficiency of the RLL code is typically measured by a code rate. For every m-bits or m-bytes of user data, an n-bit or n-byte encoded word is written to the storage media. RLL codes are used to eliminate unwanted bit patterns in the data and typically do not have error correction capability. RLL coding, however, reduces data storage capacity by increasing channel bit density (CBD), which reduces a signal to noise ratio (SNR) and may lead to lower reliability.

Figure 1:
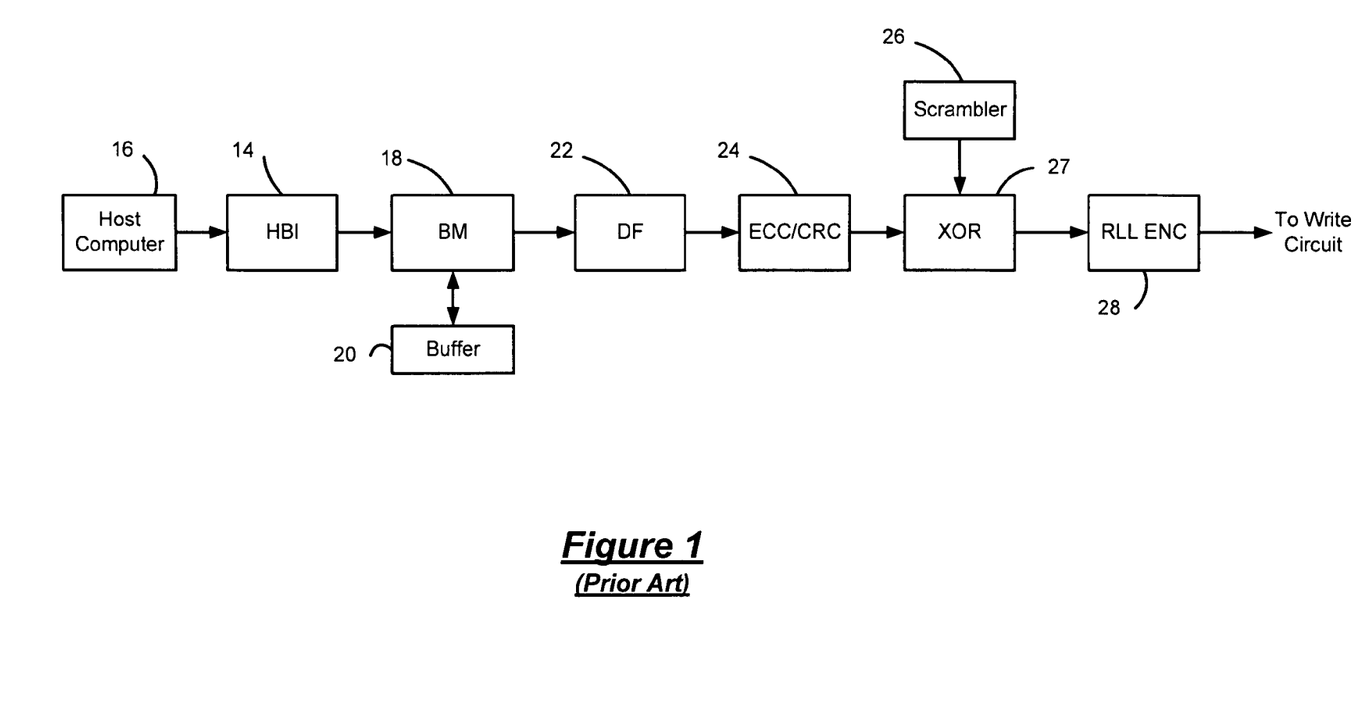
FIG. 1 is a functional block diagram of a data storage system with RLL coding according to the prior art.

Referring now to FIG. 1, a write-path of a data storage system with RLL coding is shown. A host bus interface (HBI) 14 receives user data from a host computer 16. A buffer manager (BM) 18 initially stores the user data in a buffer 20 and then sends the user data from the buffer 20 to a disk formatter (DF) 22 with proper timing. An ECC/CRC encoder 24 appends CRC bits to the user data. The CRC bits are calculated based on the user data.

ECC bits are computed based on the user data and the CRC bits and appended thereto. A scrambler 26 generates a pseudo-random scrambling sequence that is based on a polynomial and seed. The user data and the scrambling sequence are input to an XOR gate 27, which outputs scrambled user data. A RLL encoder 28 is used to constrain the unwanted bit patterns in the scrambled user data sequence.

To increase SNR and data storage capacity, data storage systems were developed without RLL coding using data-dependent scramblers (DDS). Data is processed by the DDS to eliminate unwanted bit patterns. The DDS is disclosed in "Improved Data Coding For Enforcing Constraints On Ones and Zeros In a Communications Channel", U.S. patent application Ser. No. 10/423,552, filed Apr. 25, 2003, which is commonly assigned and is hereby incorporated by reference in its entirety. The scrambled user data from the DDS is forwarded to an ECC/CRC encoder, which generates and appends CRC and ECC bits to the DDS coded user data.

Because the CRC and ECC bits may also contain unwanted bit patterns, traditional RLL coding is used to encode the ECC/CRC portion but not the user data. The data storage system is still referred to as being without RLL coding because the CRC and/or ECC bits are relatively small in number as compared to the number of bits in the user data.

Figure 2:
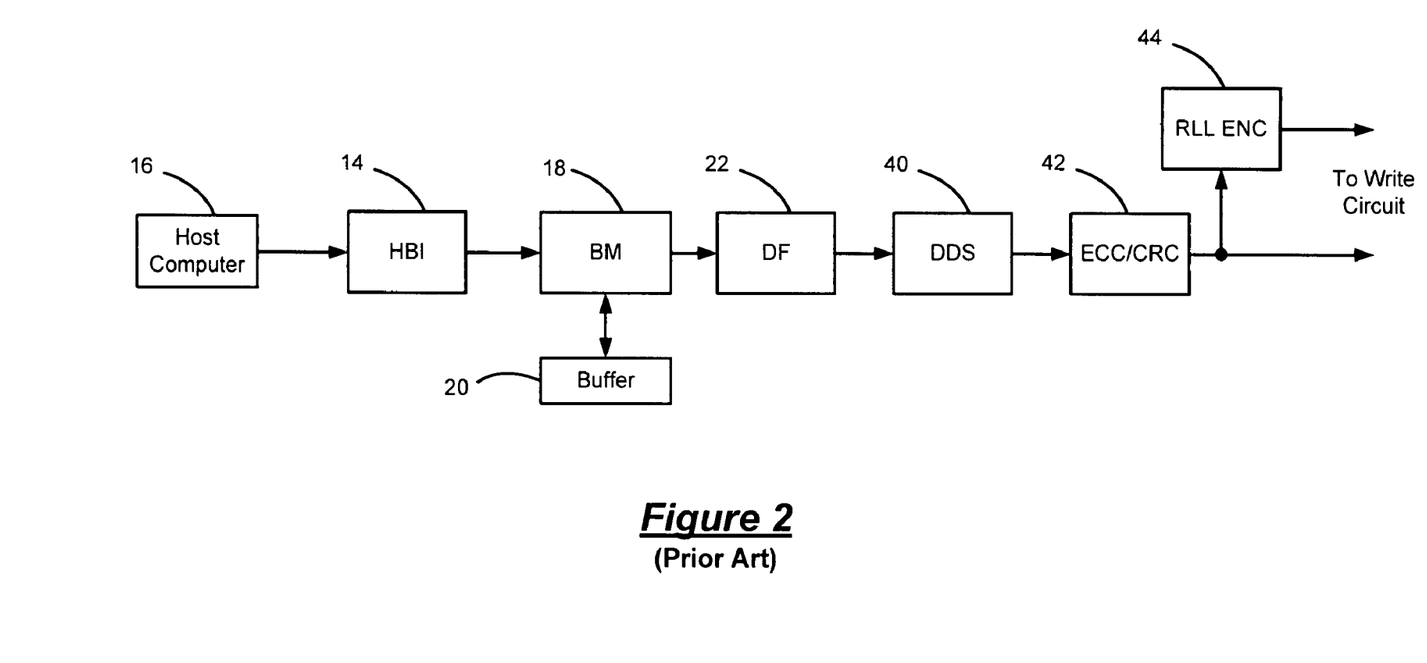
FIG. 2 is a functional block diagram of a data storage system with a data dependent scrambler (DDS) coding according to the prior art.

Referring now to FIG. 2, a write-path of a data storage system that includes the DDS is shown. The host computer 16 generates user data that is transferred to the host bus interface (HBI) 14. The buffer manager (BM) 18 receives the user data from the HBI 14 and controls the data flow through the write path. The user data is periodically stored in the buffer 20. The BM 18 passes the user data on based on sequence timing of data flow through the write path. The disk formatter (DF) 22 receives the user data from the BM 18 and formats the user data.

The DDS 40 receives the user data from the DF 22 and scrambles the user data to eliminate the unwanted bit patterns. An ECC/CRC encoder 42 appends CRC bits that are calculated based on the scrambled user data. ECC bits are also computed based on the scrambled user data and the CRC bits. The ECC bits are also appended to the scrambled user data. The DDS 40 ensures that the maximum number of consecutive zeros (or the Global constraint or G-constraint) is at most 18 when the symbol size M is equal to 10. In some circumstances, it is desirable to improve the Global constraint.

SUMMARY OF THE INVENTION

Accordingly, the present invention provides a data dependent scrambler for a communications channel that receives a user data sequence including N symbols each with M bits. The data dependent scrambler includes a seed finder that selects a scrambling seed and a first scrambler that receives said user data sequence and said scrambling seed from said seed finder. The first scrambler generates a scrambled user data sequence. A first encoder identifies a string of X consecutive zeros in adjacent symbols of the scrambled used data sequence and replaces one of the adjacent symbols with an all-one symbol. The first encoder replaces the other of the adjacent symbols with first bits representing a position of the string of X consecutive zeros and second bits representing bits of the adjacent symbols that are not in the string of X consecutive zeros.

In other features, X is greater than M. Both of the adjacent symbols are not all-zero. The seed finder selects the scrambling seed based upon the symbols in the user data sequence.

In other features, X is equal to 12 and M is equal to 10. The start position is identified using Y least significant bits of the second symbol. Y is equal to 3.

In still other features, the data dependent scrambler further includes an H-code token finder that generates an H-code token that is dependent upon the symbols in the user data sequence. An H-code encoder receives the scrambled user data sequence from the scrambler and increases a Hamming weight of the scrambled user data sequence using the H-code token. The H-code encoder outputs the scrambled user data to the encoder. The data dependent scrambler is implemented in a write path of a data storage system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. For purposes of clarity, the same reference numbers will be used in the drawings to identify similar elements.

While the present invention will be described in the context of a data storage system, skilled artisans will appreciate that the present invention can be applied to any binary communications channel with constraints on the number of consecutive ones or zeros. As will be described further below, the data storage system according to the present invention does not employ RLL coding on a user data portion. The present invention discloses a coding technique that eliminates unwanted bit patterns with a smaller reduction in data storage capacity as compared to RLL coding. In other words, the coding technique according to the present invention reduces the channel bit density (CBD) less than data storage systems using RLL coding on the user data. As used herein, the term data dependent scrambler (DDS) is defined as a scrambler that alters at least one of a selected scrambler, a generating polynomial, a seed, and a scrambling sequence based upon current user data that is to be scrambled.

The DDS according to the present invention selects a scrambling seed that is dependent upon the symbols in the user data sequence. The DDS optionally performs coding to improve the Hamming weight of the scrambled user data sequence. Instead of performing coding to improve the number of zeros in interleaved subsequences, the present invention performs coding to improve the G-constraint. For example, for M=10, prior approaches produce G=18 and the present invention produces G=11.

Figure 3:
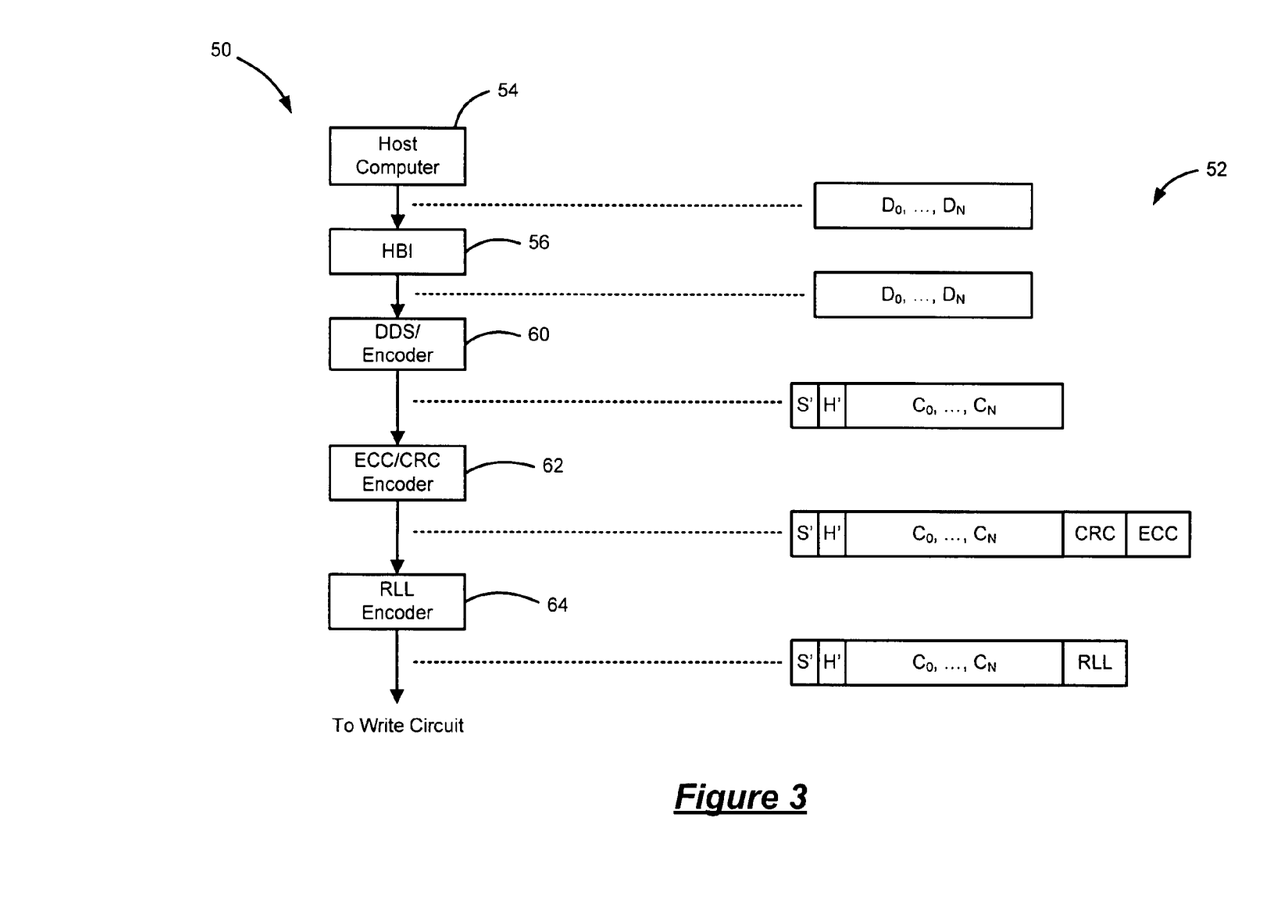
FIG. 3 is a functional block diagram of a write path of a communications channel according to the present invention and corresponding user data.

Referring now to FIG. 3, a write path 50 of a communications channel is illustrated with a corresponding user data description that is generally identified at 52. A host computer 54 outputs user data to a host bus interface (HBI) 56. Although not illustrated, other elements of the write path 50 may also include the buffer manager 18, the buffer 20, and the disk formatter 22 as shown in FIGS. 1 and 2. A data dependent scrambler (DDS)/encoder 60 receives the user data from the HBI 56 and processes the user data to remove unwanted bit patterns. The scrambled user data from the DDS/encoder 60 is processed by an ECC/CRC encoder 62, which appends CRC bits that are calculated based on the scrambled user data and ECC bits that are calculated based on the scrambled user data and the CRC bits. A RLL encoder 64 encodes the ECC and CRC bits to remove any undesired bit patterns in these portions. The scrambled user data and the RLL bits are passed on to a write circuit.

Figure 4:
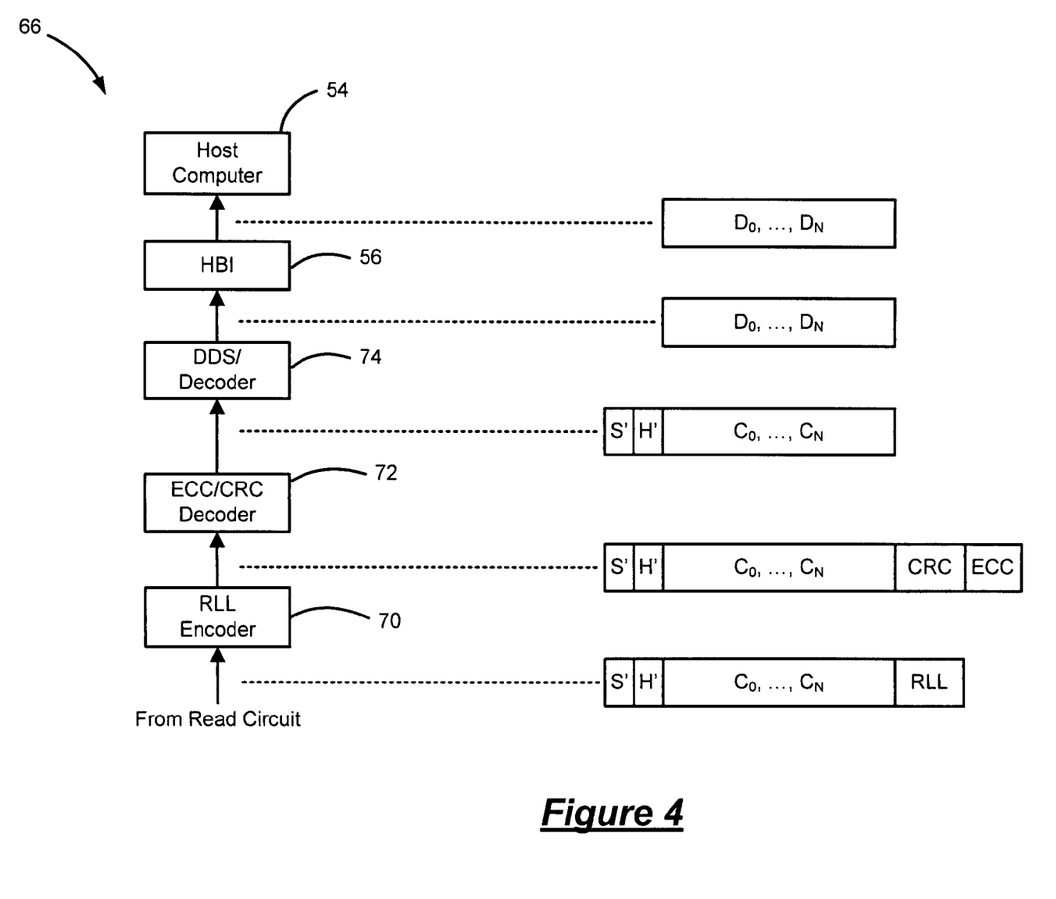
FIG. 4 is a functional block diagram of a read path of the communications channel according to the present invention and corresponding user data.

Referring now to FIG. 4, components of a read path 66 of the communications channel are illustrated with a corresponding user data description that is generally identified at 68. The read path 66 transfers data from the data storage system to the host computer 54. Although not illustrated, other elements of the read path 66 can include the buffer manager 18, the buffer 20, and the disk formatter 22 shown in FIGS. 1 and 2. An RLL decoder 70 decodes the RLL code that was generated based on the ECC and CRC bits. An ECC/CRC decoder 72 receives the output of the RLL decoder 70 and attempts to correct all possible errors in the user data. A DDS/decoder 74 reverses the scrambling and encoding that was performed by the DDS/encoder 60.

Figure 5A:
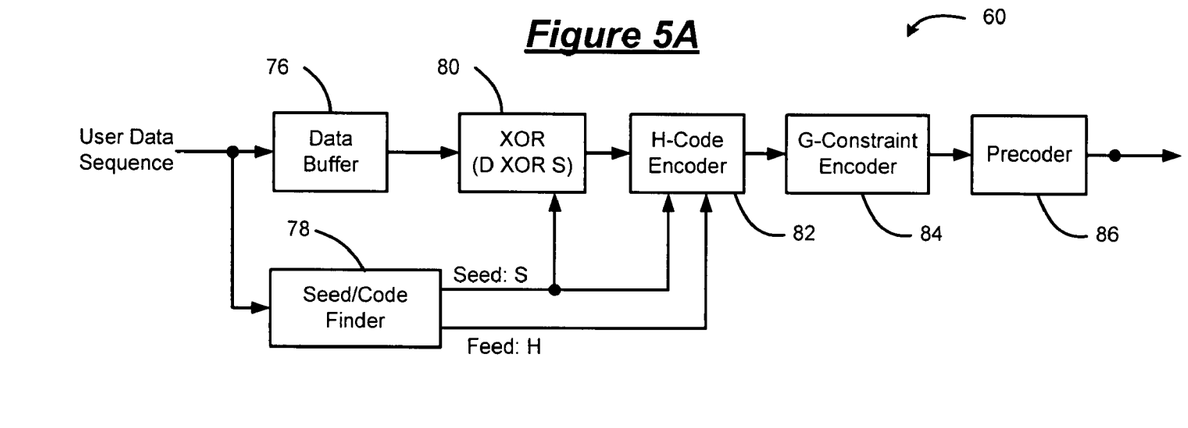
FIGS. 5A and 5B are functional block diagrams of data dependent scramblers (DDS) in the communication channel for the write path and read path, respectively, according to the present invention.

Referring now to FIG. 5A, the DDS/encoder 60 is shown in further detail and includes a data buffer 76 that receives the user data and coordinates data transfer timing through the DDS/encoder 60. A seed/code finder 78 generates a scrambling seed (S) and an H-code token (H) as described in further detail below. A first exclusive OR (XOR) gate 80 performs a bit-wise XOR operation on the user data and the scrambling seed (S) from the seed/code finder 78 to generate a scrambled user data sequence.

An H-code encoder 82 receives the scrambled user data sequence from the XOR gate 80 and the H-code token H and encodes the scrambled user data sequence to improve the worst-case Hamming weight thereof, as will be described further below. A G-constraint encoder 84 receives the encoded and scrambled data sequence and encodes the data sequence to limit the maximum length of a run of zeros in the sub-sequences, as will be described further below. A precoder 86 optionally transfers all data in the interleaved nonreturn-to-zero-inverse (INRZI) or nonreturn-to-zero-inverse (NRZI) domain into the nonreturn-to-zero (NRZ) domain.

The operation of the DDS/encoder 60 will be described with reference to FIGS. 3 and 5A. In this description, an exemplary M-bit symbol data sequence ($D=\{D_{N-1}, D_{N-2}, \ldots, D_0\}$) of size N is used, where M=10 (i.e., 10-bit symbol data sequence). As can be appreciated, any sequence length or symbol size can be used. The user data (D) is initially sent to the data buffer 76 and the seed/code finder 78. The user data is output to the first XOR 80. The delay of the data buffer 76 is preferably sufficient to allow the scrambling seed S and H-code token H to be generated by the seed/code finder 78.

Given the exemplary data sequence D, there are 1023 non-zero 10-bit symbols. More specifically, if the number of bits in the symbol is M, it is always possible to find a seed S if $N<2^M$. This is because not all of the $2^M$ different possible symbols can be included in a data sequence of fewer than $2^M$ symbols. Assuming that the user data includes 4096 bits that are organized into 10-bit symbols, there are at least 203 (1023−2*410) non-zero symbols that are different from any of the data symbols and their complements (i.e., bit-wise inversion). More particularly, the seed/code finder 78 preferably excludes symbols with a Hamming weight of one. S and H are selected such that they are different from any of the user data symbols and their complements. H is also not the complement of S. S is transmitted to the first XOR gate 80 and S and H are transmitted to the H-code encoder 82.

A scrambling sequence {S, S, . . . , S} is formed by repeating the scrambling seed S N times. The first XOR gate 80 performs bit-wise XOR of the scrambling sequence {S, S, . . . , S} with the data sequence D={$D_{N-1}, D_{N-2}, \ldots, D_0$} to obtain a scrambled sequence C={$C_{N-1}, C_{N-2}, \ldots, C_0$}. The scrambled data sequence (C={$C_{N-1}, C_{N-2}, \ldots, C_0$}) does not contain either an all-zero symbol or an all-one symbol. At a minimum, each symbol includes one "1" and nine "0"'s, which provides a worst-case Hamming weight of one (or 10% for M=10) for the scrambled user data sequence.

Figure 5B:
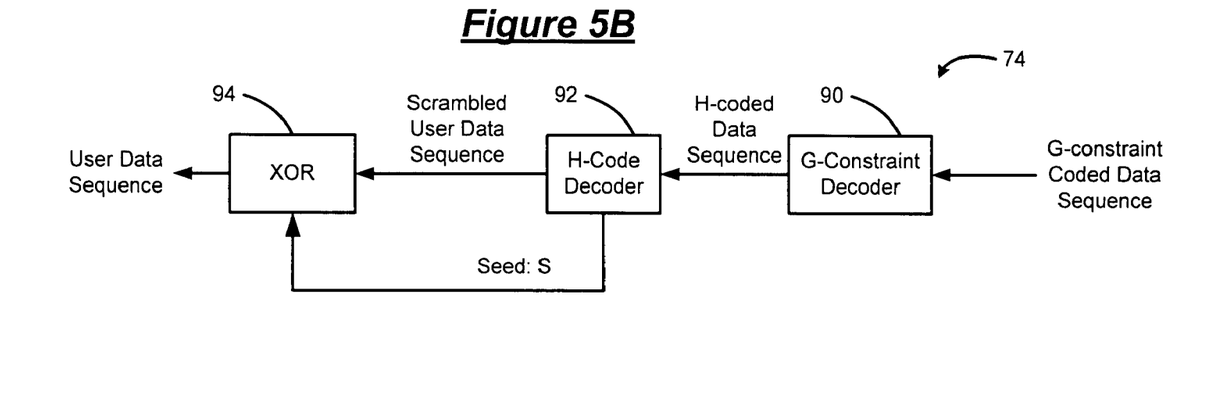

To improve the worst-case Hamming weight of the scrambled user data sequence C, the H-code encoder 82 uses a first token ($token_s$) and its complement ($token_2$) to perform additional coding. The H-code decoder 92 that is associated with the DDS/decoder 74 on the read path 66 reverses the H-code encoding. The H-code encoder 82 generates $token_1$ by calculating S XOR H. Since H is different from any of the user data symbols and their complements, it follows that both $token_1$ and $token_2$ are different from any of the scrambled data symbols of the set C. The H-code encoder 82 appends both S and H to the H-coded data sequence. Both S and H are processed by the G-constraint encoder 84 along with the H-coded scrambled data symbols. S' and H' correspond to S and H after the G-constraint encoding described below.

The H-code encoder 82 maps M bit symbols to less than M bit symbols (for example, 10-bits to 6-bits using a look-up table) in certain circumstances that are described below. The 6-bit patterns have a Hamming weight of at least weight two. The 10-bit to 6-bit map can be stored in a look-up table. There are ten symbols with a Hamming weight one and forty-five symbols having a Hamming of weight two. In total, there are fifty-five 10-bit symbols to convert using the table. Further, there are fifteen weight two 6-bit patterns, twenty weight three 6-bit patterns, fifteen weight four 6-bit patterns, six weight five 6-bit patterns and one weight six 6-bit pattern. Therefore, the fifty-five weight one and weight two 10-bit symbols can be converted into fifty-five of the fifty-seven possible 6-bit symbols of weight two or greater. This enables a one-to-one correspondence that is both static and reversible.

The H-code encoder 82 processes the scrambled symbol set C two symbols at a time. If the total Hamming weight of the two symbol group is at least four, the data is passed on without change. If the total Hamming weight of the two symbol group is two or three (i.e., [1,1] or [1,2]), a symbol replacement occurs. The H-code encoder 82 inserts $token_1$ for the symbol on the left (i.e., the first symbol of the two-symbol set). For the symbol on the right (i.e., the second symbol of the two-symbol set), the first four bits of the 10-bit symbol are used to indicate the position of the "1" in the symbol having the Hamming weight of one. The second symbol is converted into a 6-bit symbol using the table described above. If the Hamming weight of the two-symbol group is three with [2,1], the H-code encoder 82 inserts $token_2$ on the left. The H-code encoder 82 uses the first four bits of the 10-bit symbol to indicate the position of the "1" in the Hamming weight one symbol. The second symbol is converted into a 6-bit symbol using the table described above. A more detailed description of the operation and function of the H-code encoder 82 is provided in co-pending U.S. patent application Ser. No. 10/693,796, entitled "Methods and Apparatus for Improving Minimum Hamming Weights of a Sequence", filed on Aug. 12, 2003, which is commonly assigned and which is incorporated herein by reference in its entirety.

The H-coded scrambled data sequence does not contain either the all-zero symbol or the all-one symbol. As a result, there are at most eighteen consecutive zeros in the H-coded data sequence (e.g., G=18 for M=10). The G-constraint encoder 84 further reduces the maximum length of a run of zeros.

Before using the G-constraint encoder 84, the G-constraint is equal to 18 for M=10 because the H-coded data sequence contains neither the all-zero symbol nor the all-one symbol. Therefore, the worst case is when a symbol 1000000000 is followed by a symbol 0000000001. The G-constraint encoder 84 significantly improves the G-constraint from G=18 to G=11.

Referring now to FIG. 5B, the DDS/decoder 74 on the read path is shown. The DDS/decoder 74 includes a G-constraint decoder that reverses the coding that was performed by the G-constraint encoder 84, as will be described below. The output of the G-constraint decoder 90 is input to a H-code decoder 92, which reverses the encoding that was performed by the H-code encoder 82 and outputs a seed (S) and a scrambled user data sequence to an XOR gate 94. The XOR gate outputs the user data sequence.

Figure 6A:
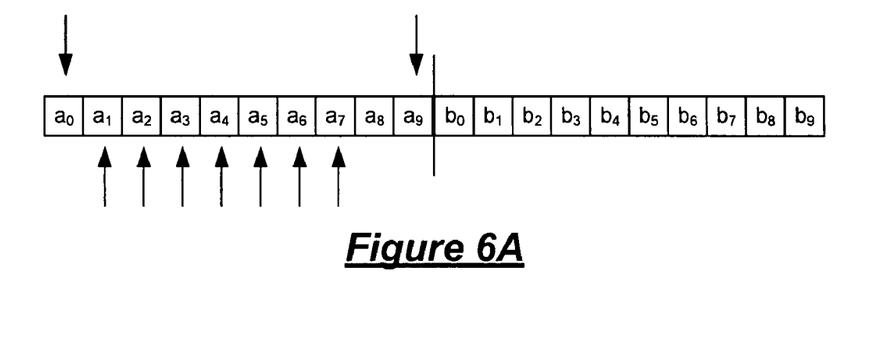
FIGS. 6A and 6B illustrate G-constraint encoding according to the present invention.
Figure 6B:
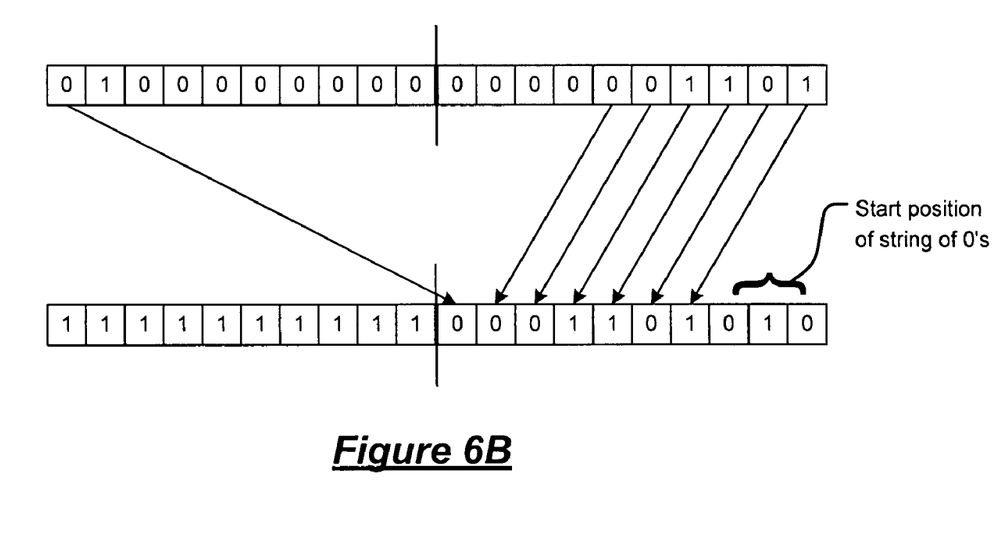

Referring now to FIGS. 6A and 6B, two adjacent symbols are shown. For any two adjacent symbols with a string of 12 consecutive zeros, the last zero position of this string cannot be position 9 of the second symbol. Otherwise, the second symbol would need to be an all-zero symbol, which cannot be output by the H-code encoder. For the same reason, the start position of the zero string cannot be the zero position of the first symbol.

Since the string of zeros has 12 zeros or more, the possible start positions of the zero string are limited to positions 1, 2, 3, 4, 5, 6, and 7. Therefore, only three bits are needed to indicate the start position of a zero string having a length of at least 12 bits for M=10. In addition, the bit that is located in a position that immediately precedes the zero string must be a 1. Therefore, there are 20-12-1=7 bits that need to be recorded when M=10.

The G-constraint encoder 84 determines whether there is a string of zeros having a length that is greater than or equal to 12 in any two consecutive symbols. If true, the first symbol is replaced by the all-one symbol. The second symbol is replaced by the following: bit 0 to bit 6 are used to record the remaining seven bits. Bit 7 to bit 9 are used to indicate the start position of the zero string. Note that if the length the zero string is more than 12, the $13^{th}$ zero and subsequent zeros are recorded using bit 0 to bit 6.

One example implementation of the G-constraint code is shown in FIG. 6B. Note that the last three bits of the second symbol after G-constraint coding must contain at least a single 1. Therefore, the maximum number of zeros in the second G-constraint coded symbol and the next symbol is (2+9)=11. In other words, the worst case occurs when the second symbol has a 1 in bit position 7 and the subsequent symbol in the user data is 0000000001. As a result of the G-code encoding, the global constraint (G) is reduced. In the case of a 10-bit symbol, the DDS achieves a G=11 and a minimum Hamming weight of 20%.

As can be appreciated, the G-constraint encoder is incremented one symbol at a time rather than two symbols at a time. If G-constraint encoding is performed on two adjacent symbols, such as d0 and d1, it will not be performed on d1 and d2 because, by definition, the least significant bits of d1 will contain a one which will prevent d1 and d2 from having a run of 12 consecutive zeros. However, if G-constraint encoding is not performed on d0 and d1, it can be performed on d1 and d2.

Figure 7:
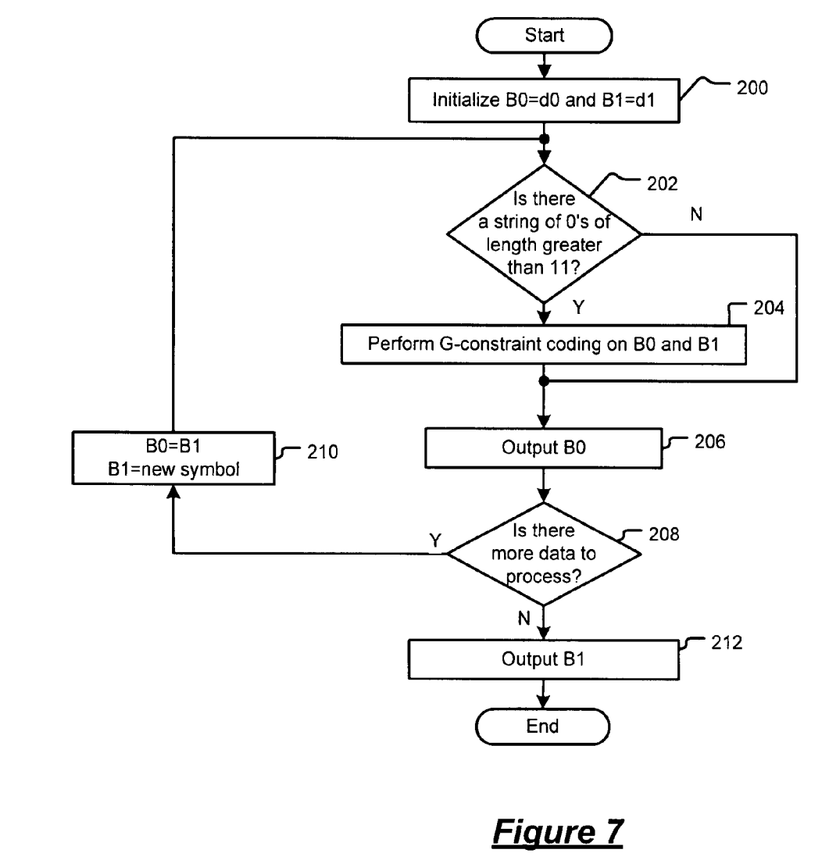
FIG. 7 is a flowchart illustrating G-constraint encoding along the write path of the communications channel.

Referring now to FIG. 7, steps that are performed by the G-constraint encoder 84 are shown in further detail. In step 200, the G-constraint encoder 84 initializes B0=d0, which is the first symbol, and B1=d1, which is the second symbol that is adjacent to the first symbol. In step 202, control determines whether there is a string of 0's of length greater than 11 in the symbols B0 and B1. If true, control performs G-constraint encoding on B0 and B1. In step 206, control outputs B0. If step 202 is false, control also continues with step 206. In step 208, control determines whether there is additional data to process. If true, control sets B0=B1 and B1=new symbol in step 210 and control continues with step 202. If step 208 is false, control outputs B1 in step 212 and control ends.

Figure 8:
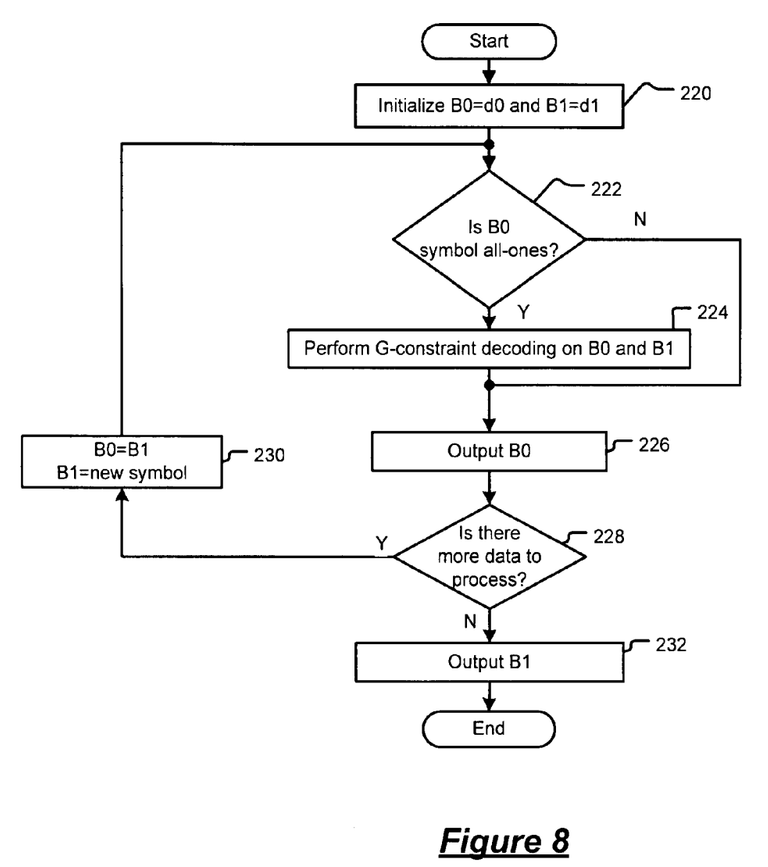
FIG. 8 is a flowchart illustrating G-constraint decoding along the read path of the communications channel.

Referring now to FIG. 8, steps that are performed by the G-constraint decoder 90 in FIG. 5B are shown in further detail. In step 220, the G-code decoder 90 initializes B0=d0, which is the first symbol, and B1=d1, which is the second symbol that is adjacent to the first symbol. In step 222, control determines whether symbol B0 is an all-one symbol. If true, control performs G-constraint decoding on B0 and B1. In step 226, control outputs B0. If step 222 is false, control also continues with step 226. In step 228, control determines whether there is additional data to process. If true, control sets B0=B1 and B1=new symbol in step 230 and control continues with step 222. If step 228 is false, control outputs B1 in step 232 and control ends.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A data dependent descrambler for a communications channel that receives a scrambling seed and a scrambled user data sequence with N symbols each with M bits, the data dependent descrambler comprising:
    a first decoder that analyzes adjacent symbols of said scrambled user data sequence, that performs G-constraint decoding on said adjacent symbols when a first of said adjacent symbols is an all-one symbol, and that does not perform G-constraint decoding when said first of said adjacent symbols is not an all-one symbol; and
    a first descrambler that communicates with said first decoder and that generates a user data sequence based on said scrambled user data sequence and said scrambling seed.

2. The data dependent descrambler of claim 1 wherein said first decoder performs G-constraint decoding by replacing said all-one symbol with an all-zero symbol, by identifying a start position of a string of X consecutive zeros in said adjacent symbols of said scrambled user data sequence, by recovering second bits from said adjacent symbols representing bits of said adjacent symbols that are not in said string of X consecutive zeros, and by substituting said recovered second bits into said adjacent symbols.

3. The data dependent descrambler of claim 1 wherein X>M.

4. The data dependent descrambler of claim 2 wherein X=12 and M=10.

5. The data dependent descrambler of claim 2 wherein said start position is identified using Y least significant bits of a second one of said adjacent symbols.

6. The data dependent descrambler of claim 5 wherein Y=3.

7. The data dependent descrambler of claim 1 further comprising an H-code decoder that receives said scrambled user data sequence from said first decoder, that decreases a Hamming weight of said scrambled user data sequence using an H-code token and that outputs said scrambled user data to said descrambler.

8. The data dependent descrambler of claim 1 wherein said data dependent descrambler is implemented in a write path of a data storage system.

9. The data dependent descrambler of claim 1 wherein said descrambler performs a bitwise exclusive (XOR) operation.

10. A data dependent descrambler for a communications channel that receives a scrambling seed and a scrambled user data sequence with N symbols each with M bits, the data dependent descrambler comprising:
    first decoding means for analyzing adjacent symbols of said scrambled user data sequence, for performing G-constraint decoding on said adjacent symbols when a first of said adjacent symbols is an all-one symbol, and for not performing G-constraint decoding when said first of said adjacent symbols is not an all-one symbol; and
    first descrambling means that communicates with said first decoding means for generating a user data sequence based on said scrambled user data sequence and said scrambling seed.

11. The data dependent descrambler of claim 10 wherein said first decoding means performs G-constraint decoding by replacing said all-one symbol with an all-zero symbol, by identifying a start position of a string of X consecutive zeros in said adjacent symbols of said scrambled user data sequence, by recovering second bits from said adjacent symbols representing bits of said adjacent symbols that are not in said string of X consecutive zeros, and by substituting said recovered second bits into said adjacent symbols.

12. The data dependent descrambler of claim 10 wherein X>M.

13. The data dependent descrambler of claim 12 wherein X=12 and M=10.

14. The data dependent descrambler of claim 11 wherein said start position is identified using Y least significant bits of a second one of said adjacent symbols.

15. The data dependent descrambler of claim 14 wherein Y=3.

16. The data dependent descrambler of claim 10 further comprising H-code decoding means for receiving said scrambled user data sequence from said first decoding means, for decreasing a Hamming weight of said scrambled user data sequence using an H-code token and for outputting said scrambled user data to said descrambling means.

17. The data dependent descrambler of claim 10 wherein said data dependent descrambler is implemented in a write path of a data storage system.

18. The data dependent descrambler of claim 10 wherein said descrambling means performs a bitwise exclusive (XOR) operation.

19. A method for operating a data dependent descrambler for a communications channel that receives a scrambling seed and a scrambled user data sequence with N symbols each with M bits, the method comprising:

analyzing adjacent symbols of said scrambled user data sequence;

performing G-constraint decoding on said adjacent symbols when a first of said adjacent symbols is an all-one symbol; and not performing G-constraint decoding when said first of said adjacent symbols is not an all-one symbol.

20. The method of claim 19 further comprising generating a user data sequence based on said scrambled user data sequence and said scrambling seed.

21. The method of claim 19 wherein said performing G-constraint decoding step includes:

replacing said all-one symbol with an all-zero symbol;

identifying a start position of a string of X consecutive zeros in said adjacent symbols of said scrambled user data sequence;

recovering second bits from said adjacent symbols representing bits of said adjacent symbols that are not in said string of X consecutive zeros; and substituting said recovered second bits into said adjacent symbols.

22. The method of claim 19 wherein X>M.

23. The method of claim 21 wherein X=12 and M=10.

24. The method of claim 21 further comprising identifying said start position using Y least significant bits of a second one of said adjacent symbols.

25. The method of claim 24 wherein Y=3.

26. The method of claim 19 further comprising decreasing a Hamming weight of said scrambled user data sequence using an H-code token.

* * * * *